United States Patent
Horita et al.

(10) Patent No.: US 12,381,079 B2
(45) Date of Patent: *Aug. 5, 2025

(54) METHOD OF MANUFACTURING SEMICONDUCTOR DEVICE, SUBSTRATE PROCESSING APPARATUS, RECORDING MEDIUM AND METHOD OF PROCESSING SUBSTRATE

(71) Applicant: KOKUSAI ELECTRIC CORPORATION, Tokyo (JP)

(72) Inventors: Hideki Horita, Toyama (JP); Ryota Horiike, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/154,492

(22) Filed: Jan. 13, 2023

(65) Prior Publication Data

US 2023/0170215 A1 Jun. 1, 2023

Related U.S. Application Data

(63) Continuation of application No. 17/030,154, filed on Sep. 23, 2020, now Pat. No. 11,587,788.

(30) Foreign Application Priority Data

Oct. 28, 2019 (JP) .................. 2019-195237

(51) Int. Cl.
*H01L 21/02* (2006.01)
*C23C 16/24* (2006.01)
(Continued)

(52) U.S. Cl.
CPC ........ *H01L 21/02645* (2013.01); *C23C 16/24* (2013.01); *C23C 16/45544* (2013.01);
(Continued)

(58) Field of Classification Search
None
See application file for complete search history.

(56) References Cited

U.S. PATENT DOCUMENTS 11,587,788 B2 * 2/2023 Horita ............... H01L 21/02595
2010/0105192 A1 4/2010 Akae et al.
(Continued)

FOREIGN PATENT DOCUMENTS

| CN | 107180749 A | 9/2017 |
| JP | 2005-183514 A | 7/2005 |

(Continued)

OTHER PUBLICATIONS

Chinese Office Action issued on Nov. 13, 2023 for Chinese Patent Application No. 202010982460.4.
(Continued)

*Primary Examiner* — Jack S Chen
(74) *Attorney, Agent, or Firm* — Volpe Koenig

(57) ABSTRACT

There is provided a technique that includes: (a) forming a silicon seed layer on a substrate by performing a cycle a predetermined number of times, the cycle including non-simultaneously performing: (a1) supplying a first gas containing halogen and silicon to the substrate; and (a2) supplying a second gas containing hydrogen to the substrate; and (b) forming a film containing silicon on the silicon seed layer by supplying a third gas containing silicon to the (Continued)

substrate, wherein a pressure of a space in which the substrate is located in (a2) is set higher than a pressure of the space in which the substrate is located in (a1).

20 Claims, 7 Drawing Sheets

(51) Int. Cl.
 *C23C 16/455* (2006.01)
 *C23C 16/52* (2006.01)
(52) U.S. Cl.
 CPC ........ *C23C 16/52* (2013.01); *H01L 21/02532* (2013.01); *H01L 21/02667* (2013.01)

(56) References Cited

U.S. PATENT DOCUMENTS

| | | |
|---|---|---|
| 2016/0141173 A1 | 5/2016 | Moriya et al. |
| 2017/0263441 A1 | 9/2017 | Orihashi et al. |
| 2021/0125828 A1 | 4/2021 | Horita et al. |

FOREIGN PATENT DOCUMENTS

| | | |
|---|---|---|
| JP | 2014-064041 A | 4/2014 |
| JP | 2014-067796 A | 4/2014 |
| JP | 2017-162974 A | 9/2017 |
| TW | 201637135 A | 10/2016 |

OTHER PUBLICATIONS

Taiwanese Office Action issued on Jul. 6, 2021 for Taiwanese Patent Application No. 109128511.
Singapore Written Opinion issued on Aug. 3, 2021 for Singapore Patent Application No. 10202009323W.
Singapore Search Report issued on Aug. 3, 2021 for Singapore Patent Application No. 10202009323W.
Korean Office Action issued on Feb. 3, 2022 for Korean Patent Application No. 10-2020-0121285.
Office Action issued on Sep. 28, 2021 for Japanese Patent Application No. 2019-195237.
Korean Office Action issued on Jul. 4, 2023 for Korean Patent Application No. 10-2022-0183603.

\* cited by examiner

FIG. 7

| Sample | Si seed layer thickness (Å) | Cl concentration (at/cm³) | Average grain size (μm) | Step coverage (AR : 150) | Film density (g/cm³) |
|---|---|---|---|---|---|
| 1 | 13 | $4 \times 10^{21}$ | — | — | — |
| 2 | 13 | $3 \times 10^{21}$ | 0.17 | 93% | 1.61 |
| 3 | 13 | $4 \times 10^{20}$ | 0.20 | — | — |
| 4 | 13 | $3 \times 10^{20}$ | — | — | — |
| 5 | Less than 1 | $1 \times 10^{20}$ | 0.22 | 98% | 1.81 |

METHOD OF MANUFACTURING SEMICONDUCTOR DEVICE, SUBSTRATE PROCESSING APPARATUS, RECORDING MEDIUM AND METHOD OF PROCESSING SUBSTRATE

CROSS-REFERENCE TO RELATED APPLICATION

This application is a continuation of U.S. patent application Ser. No. 17/030,154, filed Sep. 23, 2020, which is based upon and claims the benefit of priority from Japanese Patent Application No. 2019-195237, filed on Oct. 28, 2019, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as an example of a process of manufacturing a semiconductor device, a process of forming a silicon seed layer on a substrate and a process of forming a film containing silicon on the silicon seed layer are often carried out (for example, see Patent Document 1).

SUMMARY

The present disclosure provides some embodiments of a technique capable of improving characteristics of a film containing silicon formed on a substrate.

According to embodiments of the present disclosure, there is provided a technique that includes: (a) forming a silicon seed layer on a substrate by performing a cycle a predetermined number of times, the cycle including non-simultaneously performing: (a1) supplying a first gas containing halogen and silicon to the substrate; and (a2) supplying a second gas containing hydrogen to the substrate; and (b) forming a film containing silicon on the silicon seed layer by supplying a third gas containing silicon to the substrate, wherein a pressure of a space in which the substrate is located in (a2) is set higher than a pressure of the space in which the substrate is located in (a1).

BRIEF DESCRIPTION OF DRAWINGS

The accompanying drawings, which are incorporated in and constitute a part of the specification, illustrate some embodiments of the present disclosure.

FIG. 7 is a diagram illustrating measurement results of a Cl concentration (at/cm$^3$) of a silicon seed layer, and an average grain size (µm), step coverage (%) and a film density (g/cm$^3$) of crystal grains of a silicon film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

EMBODIMENTS OF THE PRESENT DISCLOSURE

Some embodiments of the present disclosure will now be described with reference to FIGS. 1 to 4.

(1) Configuration of the Substrate Processing Apparatus

Figure 1:
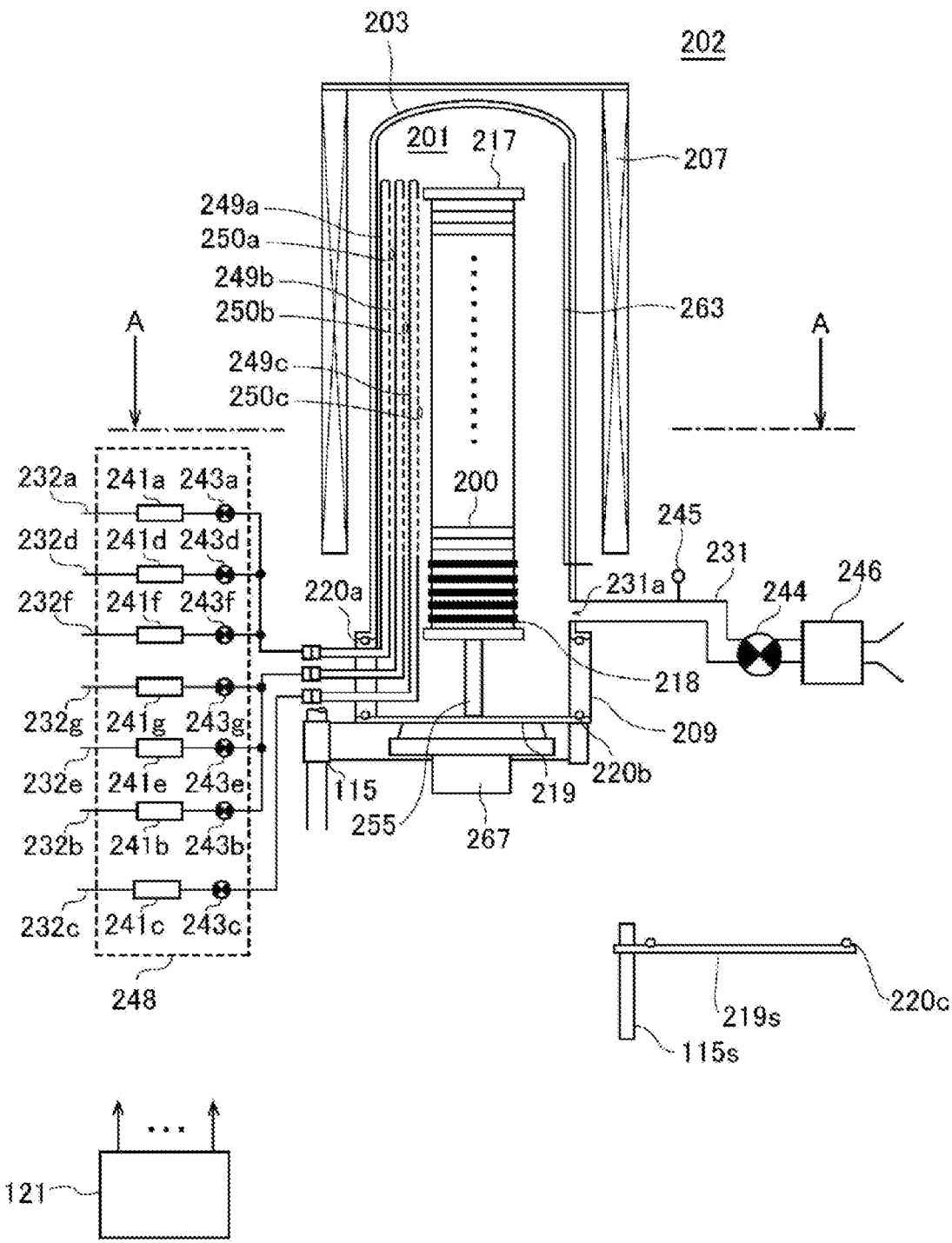
FIG. 1 is a schematic configuration diagram of a vertical type process furnace of a substrate processing apparatus suitably used in some embodiments of the present disclosure, in which a portion of the process furnace is shown in a vertical cross-sectional view.

As illustrated in FIG. 1, a process furnace 202 includes a heater 207 as a heating mechanism (temperature adjustment part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz (SiO$_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each made of a non-metallic material which is a heat resistant material such as quartz, SiC or the like. Gas supply pipes 232a to 232c are respectively connected to the nozzles 249a to 249c. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in this order at the gas supply pipes 232a to 232c from the corresponding upstream sides of gas flow, respectively. Gas supply pipes 232d and 232f are respectively connected to the gas supply pipe 232a at the downstream side of the valve 243a. Gas supply pipes 232e and 232g are respectively connected to the gas supply pipe 232b at the downstream side of the valve 243b. MFCs 241d to 241g and valves 243d to 243g are installed in this order at the gas supply pipes 232d to 232g from the corresponding upstream sides of gas flow, respectively. The gas supply pipes 232a to 232g are each made of a metal material such as stainless steel (SUS) or the like.

Figure 2:
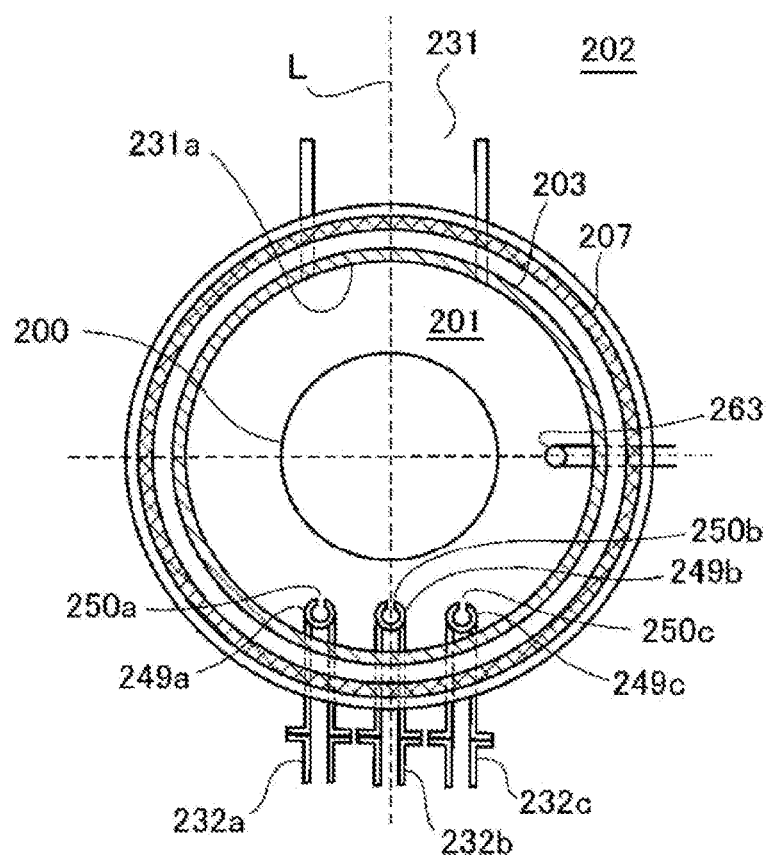
FIG. 2 is a schematic configuration diagram of a vertical type process furnace of the substrate processing apparatus suitably used in some embodiments of the present disclosure, in which a portion of the process furnace is shown in a cross-sectional view taken along line A-A in FIG. 1.

As illustrated in FIG. 2, the nozzles 249a to 249c are installed in a space with an annular shape, when seen in a plane view, between an inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, so as to extend along the wafer arrangement region. The nozzle 249b is disposed to face an exhaust port 231a, which will be described later, on a straight line in the plane view, with centers of the wafers 200 that are loaded into the process chamber 201 interposed between the nozzle 249b and the exhaust port 231a. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed at the side surfaces of the nozzles 249a to 249c, respectively. The gas supply holes 250a to 250c are opened to face the exhaust port 231a in the plane view, thus allowing a gas to be supplied toward the wafers 200. The gas supply holes 250a to 250c may be formed in a plural number between the lower portion of the reaction tube 203 and the upper portion of the reaction tube 203.

A processing gas (third gas), for example, a silane-based gas which contains silicon (Si) as a main element constituting a film to be formed on each of the wafers 200, is supplied from the gas supply pipe 232a into the process chamber 201 via the MFC 241a, the valve 243a, and the nozzle 249a. As the silane-based gas, it may be possible to use a halogen-free silicon hydride gas, for example, a monosilane ($SiH_4$, abbreviation: MS) gas.

A processing gas (first gas), for example, a gas which contains halogen and Si, that is, a halosilane gas (first halosilane gas), is supplied from the gas supply pipe 232b into the process chamber 201 via the MFC 241b, the valve 243b, and the nozzle 249b. The halogen may include chlorine (Cl), fluorine (F), bromine (Br), iodine (I), and the like. As the first halosilane gas, it may be possible to use, for example, a chlorosilane gas containing Cl and Si, for example, a hexachlorodisilane ($Si_2Cl_6$, abbreviation: HCDS) gas.

A processing gas (second gas), for example, a gas containing hydrogen (H), is supplied from the gas supply pipe 232d into the process chamber 201 via the MFC 241d, the valve 243d, the gas supply pipe 232a, and the nozzle 249a. As the H-containing gas, it may be possible to use a hydrogen ($H_2$) gas which is a reducing gas.

A processing gas (fourth gas), for example, a gas which contains halogen and Si, that is, a halosilane gas (second halosilane gas), is supplied from the gas supply pipe 232e into the process chamber 201 via the MFC 241e, the valve 243e, the gas supply pipe 232b, and the nozzle 249b. As the second halosilane gas, it may be possible to use, for example, a chlorosilane gas containing Cl and Si, for example, a dichlorosilane ($SiH_2Cl_2$, abbreviation: DCS) gas.

An inert gas, for example, a nitrogen ($N_2$) gas, is supplied from the gas supply pipes 232c, 232f and 232g into the process chamber 201 via the MFCs 241c, 241f and 241g, the valves 243c, 243f and 243g, the gas supply pipes 232a to 232c, and the nozzles 249a to 249c. The $N_2$ gas acts as a purge gas, a carrier gas, a dilution gas, or the like.

A third gas supply system (silane-based gas supply system) mainly includes the gas supply pipe 232a, the MFC 241a, and the valve 243a. A first gas supply system (first halosilane gas supply system) mainly includes the gas supply pipe 232b, the MFC 241b, and the valve 243b. A second gas supply system (H-containing gas supply system) mainly includes the gas supply pipe 232d, the MFC 241d, and the valve 243d. A fourth gas supply system (second halosilane gas supply system) mainly includes the gas supply pipe 232e, the MFC 241e, and the valve 243e. An inert gas supply system mainly includes the gas supply pipes 232c, 232f and 232g, the MFCs 241c, 241f and 241g, and the valves 243c, 243f and 243g.

One or all of various supply systems described above may be configured as an integrated supply system 248 in which the valves 243a to 243g, the MFCs 241a to 241g, and the like are integrated. The integrated supply system 248 is connected to each of the gas supply pipes 232a to 243g so that a supply operation of various kinds of gases into the gas supply pipes 232a to 232g, that is, an opening/closing operation of the valves 243a to 243g, a flow rate adjusting operation by the MFCs 241a to 241g or the like, is controlled by a controller 121 which will be described later. The integrated supply system 248 is configured as an integral type or division type integrated unit, and is also configured so that it is detachable from the gas supply pipes 232a to 232g or the like, so as to perform maintenance, replacement, expansion or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion of the sidewall of the reaction tube 203 and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening cover configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115, which is an elevator mechanism installed outside the reaction tube 203. The boat elevator 215 is configured as a transfer device (transfer mechanism) which loads or unloads (transfers) the wafers 200 into or from (out of) the process chamber 201 by moving the seal cap 219 up or down. A shutter 219s as a furnace opening cover capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed at an upper surface of the shutter 219s. An opening/closing operation (an up-down movement, operation, a rotational movement operation or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
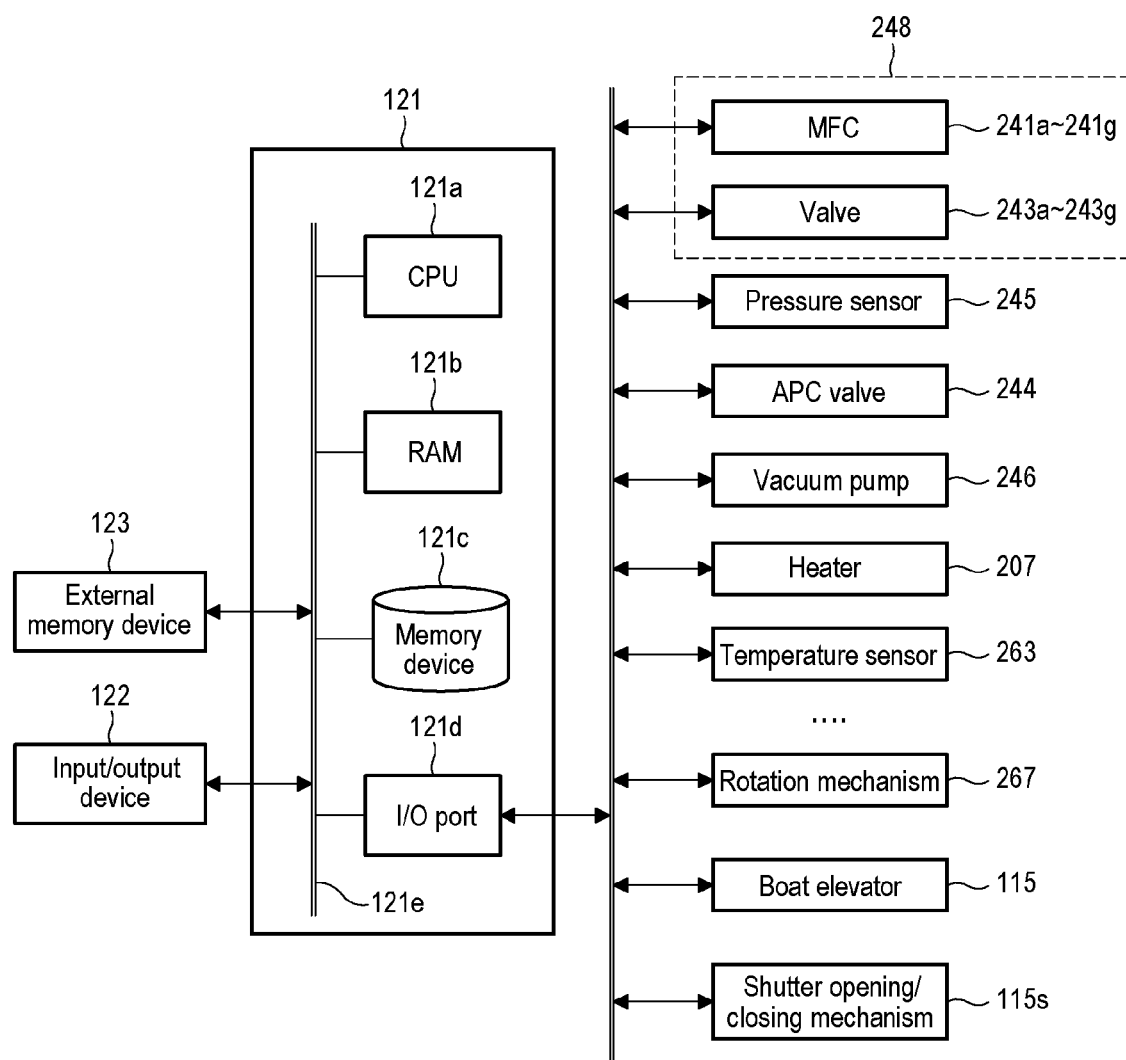
FIG. 3 is a schematic configuration diagram of a controller of the substrate processing apparatus suitably used in some embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. An input/output device 122 configured as, for example, a touch panel or the like, is connected to the controller 121.

The memory device 121c includes, for example, a flash memory, a hard disk drive (HDD), or the like. A control program that controls operations of a substrate processing apparatus, a process recipe that specifies sequences and conditions of substrate processing as described hereinbelow, or the like is readably stored in the memory device 121c. The process recipe functions as a program configured to cause the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241g, the opening/closing operation of the valves 243a to 243g, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as a MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer by using a communication means such as the Internet or a dedicated line, instead of using the external memory device 123.

(2) Substrate Processing

A substrate processing sequence example of forming a film on a wafer 200 as a substrate and then annealing this film by using the aforementioned substrate processing apparatus, that is, a film-forming sequence example, which is a process for manufacturing a semiconductor device, will be described mainly with reference to FIG. 4. In the following descriptions, operations of the respective parts constituting the substrate processing apparatus are controlled by the controller 121.

Figure 4:
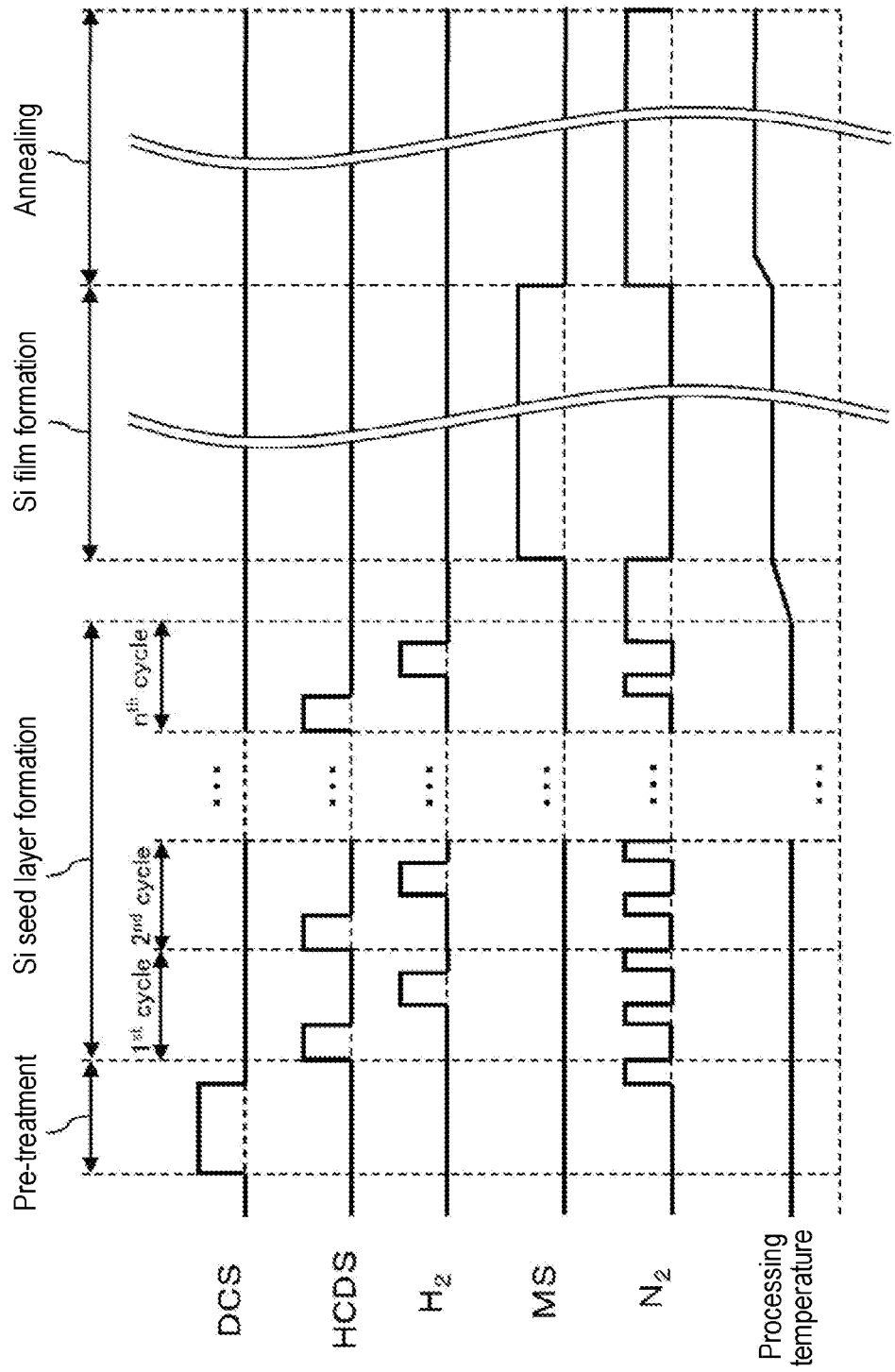
FIG. 4 is a diagram illustrating a substrate processing sequence according to a first embodiment of the present disclosure.

As illustrated in FIG. 4, the substrate processing sequence according to the embodiments of the present disclosure includes: a step of forming a silicon seed layer (hereinafter, referred to as a Si seed layer) on a wafer 200 by performing a cycle a predetermined number of times (n times, where n is an integer of 1 or more), the cycle including simultaneously performing a step of supplying a HCDS gas as a first gas to the wafer 200 (hereinafter, referred to as a HCDS gas supply) and a step of supplying a $H_2$ gas as a second gas to the wafer 200 (hereinafter, referred to as a $H_2$ gas supply) (hereinafter, referred to as Si seed layer formation); and a step of forming a silicon film (hereinafter, referred to as a Si film) as a film containing silicon on the silicon seed layer by supplying a MS gas as a third gas to the wafer 200 (hereinafter, referred to as Si film formation), wherein in the Si seed layer formation, a pressure (processing pressure) of a space in which the wafer 200 is located in the $H_2$ gas supply is set higher than a pressure (processing pressure) of the space in which the wafer 200 is located in the HCDS gas supply.

Further, the substrate processing sequence according to the embodiments further includes a step of supplying a DCS gas as a fourth gas to the wafer 200 before forming the Si seed layer (hereinafter, referred to as pre-treatment).

Further, the substrate processing sequence according to the embodiments further includes a step of annealing the Si seed layer and the Si film after forming the Si film (hereinafter, referred to as annealing).

In the present disclosure, for the sake of convenience, the substrate processing sequence described above may sometimes be denoted as follows. The same denotation will be used in the modifications and the like as described hereinbelow.

DCS→(HCDS→$H_2$)×n→MS→ANL (annealing)

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Further, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired processing temperature. In this operation, a degree of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Pre-Treatment)

Thereafter, a DCS gas is supplied to the wafer 200 in the process chamber 201.

Specifically, the valve 243e is opened to allow a DCS gas to flow through the gas supply pipe 232e. The flow rate of the DCS gas is adjusted by the MFC 241e. The DCS gas is supplied into the process chamber 201 via the gas supply pipe 232b and the nozzle 249b and is exhausted from the exhaust port 231a. At this time, the DCS gas is supplied to the wafer 200 (DCS gas supply). Simultaneously, the valves 243c, 243f, and 243g may be opened to supply a $N_2$ gas into the process chamber 201 via each of the nozzles 249a to 249c.

By supplying the DCS gas to the wafer 200 under processing conditions as described hereinbelow, a natural oxide film, an impurity or the like can be removed from the surface of the wafer 200 by a treatment action (etching action) of the DCS gas to clean the surface. Thus, the surface of the wafer 200 can become a surface on which adsorption of Si, that is, formation of a Si seed layer, easily goes ahead in the Si seed layer formation as described hereinbelow. By setting the supply time of the DCS gas in the pre-treatment longer than the supply time of a HCDS gas in the HCDS gas supply as described hereinbelow, it is possible to reliably obtain the treatment action described above.

After the surface of the wafer 200 is cleaned, the valve 243e is closed to stop the supply of the DCS gas into the process chamber 201. Then, the interior of the process chamber 201 is vacuum-exhausted and the gas or the like remaining within the process chamber 201 is removed from the interior of the process chamber 201. At this time, the valves 243c, 243f and 243g are opened to supply a $N_2$ gas into the process chamber 201 via the nozzles 249a to 249c.

The N$_2$ gas supplied from the nozzles 249a to 249c acts as a purge gas. Thus, the interior of the process chamber 201 is purged (purge).

Processing conditions in the DCS gas supply may be exemplified as follows:

DCS gas supply flow rate: 0.1 to 1 slm
Supply time of DCS gas: 5 to 10 minutes
N$_2$ gas supply flow rate (per gas supply pipe): 0 to 20 slm
Processing temperature (first temperature): 350 to 450 degrees C., specifically 350 to 400 degrees C. in some embodiments
Processing pressure: 667 to 1,333 Pa (5 10 Torr).

Processing conditions in the purge may be exemplified as follows:

N$_2$ gas supply flow rate: 0.5 to 20 slm
Supply time of N$_2$ gas: 1 to 30 seconds
Processing pressure: 1 to 30 Pa.

Other processing conditions may be similar to the processing conditions in the DCS gas supply.

Furthermore, in the present disclosure, the expression of the numerical range such as "350 to 450 degrees C." may mean that a lower limit value and an upper limit value are included in that range. Therefore, for example, "350 to 450 degrees C." may mean "350 degrees C. or higher and 450 degrees C. or lower." The same applies to other numerical ranges.

As the fourth gas (second halosilane gas), it may be possible to use, in addition to the DCS gas, a chlorosilane gas such as a monochlorosilane (SiH$_3$Cl, abbreviation: MCS) gas, a trichlorosilane (SiHCl$_3$, abbreviation: TCS) gas, a tetrachlorosilane (SiCl$_4$, abbreviation: STC) gas, a hexachlorodisilane (Si$_2$Cl$_6$, abbreviation: HCDS) gas, an octachlorotrisilane (Si$_3$Cl$_8$, abbreviation: OCTS) gas or the like. Furthermore, as the fourth gas, it may be possible to use a tetrafluorosilane (SiF$_4$) gas, a tetrabromosilane (SiBr$_4$) gas, a tetraiodosilane (SiI$_4$) gas, or the like. That is, as the fourth gas, it may be possible to use, in addition to the chrolosilane gas, a halosilane gas such as a fluorosilane gas, a bromosilane gas, an iodosilane gas or the like. In addition, as the fourth gas, it may be possible to use a Si-free halogen-based gas such as a hydrogen chloride (HCl) gas, a chlorine (Cl$_2$) gas, a trichloroborane (BCl$_3$) gas, a chlorine fluoride (ClF$_3$) gas or the like. The fourth gas may have a molecular structure (chemical structure) different from or equal to that of the first gas. Further, if the first temperature is set equal or similar to a second temperature as described hereinbelow, a gas having a molecular structure different from that of the first gas may be used as the fourth gas, and a gas having a pyrolysis temperature higher than that of the first gas may be used under the same condition. Therefore, if the temperature condition is set in this way, it is possible to appropriately achieve the treatment effect by the fourth gas.

As the inert gas, it may be possible to use, in addition to the N$_2$ gas, a rare gas such as an Ar gas, a He gas, a Ne gas, a Xe gas or the like. This also applies to each step as described hereinbelow.

(Si Seed Layer Formation)

Next, the following steps 1 and 2 are sequentially performed.

[Step 1]

At this step, a HCDS gas is supplied to the wafer 200 in the process chamber 201.

Specifically, the valve 243b is opened to allow the HCDS gas to flow through the gas supply pipe 232b. The flow rate of the HCDS gas is adjusted by the MFC 241b. The HCDS gas is supplied into the process chamber 201 via the nozzle 249b and is exhausted from the exhaust port 231a. At this time, the HCDS gas is supplied to the wafer 200 (HCDS gas supply). Simultaneously, the valves 243c, 243f and 243g may be opened to supply a N$_2$ gas into the process chamber 201 via each of the nozzles 249a to 249c.

By supplying the HCDS gas to the wafer 200 under processing conditions as described hereinbelow, Si contained in HCDS can be adsorbed on the surface of the wafer 200 cleaned by the pre-treatment to form seeds (nuclei). A predetermined amount of Cl is contained in the nucleus formed on the surface of the wafer 200 under the processing conditions as described hereinbelow. In addition, a crystal structure of the nucleus formed on the surface of the wafer 200 becomes amorphous under the processing conditions as described hereinbelow.

After the nuclei are formed on the surface of the wafer 200, the valve 243b is closed to stop the supply of the HCDS gas into the process chamber 201. Then, the gas or the like, which remains within the process chamber 201, is removed from the interior of the process chamber 201 under the same processing procedures and processing conditions as those of the purge in the pre-treatment.

[Step 2]

After step 1 is completed, a H$_2$ gas is supplied to the wafer 200 in the process chamber 201, that is, the nuclei formed on the surface of the wafer 200.

Specifically, the valve 243d is opened to allow the H$_2$ gas to flow through the gas supply pipe 232d. The flow rate of the H$_2$ gas is adjusted by the MFC 241d. The H$_2$ gas is supplied into the process chamber 201 via the gas supply pipe 232a and the nozzle 249a and is exhausted from the exhaust port 231a. At this time, the H$_2$ gas is supplied to the wafer 200 (H$_2$ gas supply). Simultaneously, the valves 243c, 243f and 243g may be opened to supply the N$_2$ gas into the process chamber 201 via the nozzles 249a to 240c, respectively.

By supplying the H$_2$ gas to the wafer 200 under processing conditions as described hereinbelow, Cl can be desorbed from the nucleus formed on the surface of the wafer 200. Cl desorbed from the nucleus generates a gaseous substance containing Cl and is discharged from the interior of the process chamber 201.

Furthermore, in the embodiments, the pressure (processing pressure) of the space where the wafer 200 is located in the H$_2$ gas supply is set higher than the pressure (processing pressure) of the space where the wafer 200 is located in the HCDS gas supply, as described hereinbelow. By doing so, it becomes possible to promote the desorption of Cl from the nucleus in the H$_2$ gas supply. As a result, it is possible to allow the Si seed layer formed on the wafer 200 to become a layer having a low Cl concentration by performing the Si seed layer formation.

Moreover, in the embodiments, the supply flow rate of the H$_2$ gas in the H$_2$ gas supply may be set higher than the supply flow rate of the HCDS gas in the HCDS gas supply. By doing so, it becomes possible to further promote the desorption of Cl from the nucleus in the H$_2$ gas supply and to further reduce the Cl concentration in the Si seed layer formed on the wafer 200. Furthermore, in the embodiments, the supply time of the H$_2$ gas in the H$_2$ gas supply may be set longer than the supply time of the HCDS gas in the HCDS gas supply. By doing so, it becomes possible to further promote the desorption of Cl from the nucleus in the H$_2$ gas supply and to further reduce the Cl concentration in the Si seed layer formed on the wafer 200.

After Cl is desorbed from the nucleus formed on the surface of the wafer 200, the valve 243d is closed to stop the supply of the H$_2$ gas into the process chamber 201. Then, the gas or the like, which remains within the process chamber 201, is removed from the interior of the process chamber 201 under the same processing procedures and processing conditions as those of the purge in the pre-treatment.

[Performing a Predetermined Number of Times]

A cycle which alternately, that is, non-synchronously, performs steps 1 and 2 described above is implemented a predetermined number of times (n times, where n is an integer of 1 or more), whereby a seed layer in which nuclei are formed at high density, that is, a Si seed layer, can be formed on the wafer 200. In the embodiments, it is possible to allow the Si seed layer formed on the wafer 200 to become a layer having a low Cl concentration by alternately performing steps 1 and 2, that is, by performing the $H_2$ gas supply every time the HCDS gas supply is performed to desorb Cl from the nucleus formed on the surface of the wafer 200. Further, it is possible to allow the crystal structure of the Si seed layer formed on the wafer 200 to become amorphous under processing conditions as described hereinbelow.

The thickness of the Si seed layer formed on the wafer 200 can be adjusted by controlling the processing conditions such as the number of times the aforementioned cycle is performed, the processing temperature, the supply time of the HCDS gas and the like. In the embodiments, the thickness of the Si seed layer formed on the wafer 200 may be set smaller by appropriately controlling at least one of the conditions, for example, the thickness be set at a thickness of less than one atomic layer. As described above, by setting the thickness of the Si seed layer formed on the wafer 200 to be smaller, it becomes possible to allow this layer to become a layer having a lower Cl concentration, and further, to become a layer having very small Cl content (absolute amount).

Processing conditions in the HCDS gas supply may be exemplified as follows:

HCDS gas supply flow rate: 0.1 to 1 slm
Supply time of HCDS gas: 0.5 to 2 minutes
Processing temperature (second temperature): 350 to 450 degrees C., specifically 350 to 400 degrees C. in some embodiments
Processing pressure: 277 to 1,200 Pa (2 to 9 Torr), specifically 667 to 1,200 Pa (5 to 9 Torr) in some embodiments.

Other processing conditions may be similar to the processing conditions in the DCS gas supply.

Further, if the processing temperature is lower than 350 degrees C., there may be a case where Si contained in HCDS is difficult to be adsorbed on the surface of the wafer 200 and the formation of the Si seed layer on the wafer 200 is difficult. By setting the processing temperature at a temperature of 350 degrees C. or higher, Si contained in HCDS can be adsorbed on the surface of the wafer 200 to form the Si seed layer on the wafer 200.

If the processing temperature exceeds 450 degrees C., there may be a case where the HCDS gas supplied into the process chamber 201 is pyrolyzed (gas-phase decomposed) to make it difficult to control the thickness of the Si seed layer formed on the wafer 200. By setting the processing temperature at a temperature of 450 degrees C. or lower, it is possible to suppress the pyrolysis of the HCDS gas supplied into the process chamber 201 and to enhance a thickness controllability of the Si seed layer formed on the wafer 200. Thus, for example, it is possible to allow the thickness of the Si seed layer formed on the wafer 200 to become a thickness of less than one atomic layer. By setting the processing temperature at a temperature of 400 degrees C. or lower, it is possible to reliably suppress the pyrolysis of the HCDS gas supplied into the process chamber 201 and to further enhance the thickness controllability of the Si seed layer formed on the wafer 200. Thus, for example, it is possible to reliably allow the thickness of the Si seed layer formed on the wafer 200 to become a thickness of less than one atomic layer.

Further, if the processing pressure is lower than 277 Pa (2 Torr), there may be a case where Si contained in HCDS is difficult to be adsorbed on the surface of the wafer 200 and the formation of the Si seed layer on the wafer 200 is difficult. By setting the processing pressure at a pressure of 277 Pa or higher, Si contained in HCDS can be adsorbed on the surface of the wafer 200 to form the Si seed layer on the wafer 200. By setting the processing pressure at a pressure of 667 Pa (5 Torr) or higher, Si contained in HCDS can be reliably adsorbed on the surface of the wafer 200 to reliably form the Si seed layer on the wafer 200, and further, to increase a Si density and a nucleus density in the Si seed layer.

If the processing pressure exceeds 1,200 Pa (9 Torr), there may be a case where a risk that particles (foreign substances) are generated in the process chamber 201 is increased. By setting the processing pressure at a pressure of 1,200 Pa or lower, it is possible to reduce the risk that the particles (foreign substances) are generated in the process chamber 201.

The processing conditions in the $H_2$ gas supply may be exemplified as follows:

$H_2$ gas supply flow rate: 2 to 10 slm
Supply time of $H_2$ gas: 2 to 5 minutes
Processing pressure: 1,333 to 13,332 Pa (10 to 100 Torr).

Other processing conditions may be similar to the processing conditions in the DCS gas supply.

Furthermore, if the processing pressure is lower than 1,333 Pa (10 Torr), there may be a case where the effect of desorbing Cl from the nucleus described above is reduced and the Cl concentration in the Si seed layer is increased. By setting the processing pressure at a pressure of 1,333 Pa or higher, it is possible to enhance the effect of desorbing Cl from the nucleus, and to allow the Si seed layer formed on the wafer 200 to become a layer having a low Cl concentration.

If the processing pressure exceeds 13,332 Pa (100 Torr), there may be a case where time required to change the internal pressure of the process chamber 201 is prolonged, which affects a throughput of the substrate processing, that is, a productivity of the substrate processing. By setting the processing pressure at a pressure of 13,332 Pa or lower, it is possible to suppress an increase in the time required to change the internal pressure of the process chamber 201 and to reduce an influence on the throughput of the substrate processing, that is, the productivity of the substrate processing.

As the first gas (first halosilane gas), it may be possible to use, in addition to the HCDS gas, a chlorosilane gas such as a MCS gas, a DCS gas, a TCS gas, a STC gas, an OCTS gas or the like. In addition, as the first gas, it may be possible to use a $SiF_4$ gas, a $SiBr_4$ gas, a $SiI_4$ gas, or the like. That is, as the first gas, it may be possible to use, in addition to the chlorosilane gas, a halosilane gas such as a fluorosilane gas, a bromosilane gas, an iodosilane gas or the like.

As the second gas (H-containing gas), it may be possible to use, in addition to the $H_2$ gas, a reducing gas such as a $SiH_4$ gas, a deuterium ($D_2$) gas or the like.

(Temperature Rising)

After the Si seed layer is formed on the wafer 200, the output of the heater 207 is adjusted to change the internal temperature of the process chamber 201, that is, the temperature of the wafer 200, to a third temperature higher than the second temperature described above. When performing this step, the valves 243c, 243f, and 243g are opened such that a $N_2$ gas is supplied into the process chamber 201 via the nozzles 249a to 249c and is exhausted from the exhaust port 231a. Thus, the interior of the process chamber 201 is purged. After the temperature of the wafer 200 reaches the third temperature to be stabilized, the Si film formation as described hereinbelow starts.

By raising the temperature of the wafer 200 to the third temperature higher than the second temperature and waiting until the temperature of the wafer 200 is stabilized, it is possible to start polycrystallization of the Si seed layer formed on the wafer 200. Furthermore, the Si seed layer can be maintained in an amorphous state according to the processing conditions (the third temperature and a wait time) at this time.

(Si Film Formation)

After the temperature of the wafer 200 reaches the third temperature to be stabilized, a MS gas is supplied to the wafer 200 in the process chamber 201, that is, the surface of the Si seed layer formed on the wafer 200.

Specifically, the valve 243a is opened to allow the MS gas to flow through the gas supply pipe 232a. The flow rate of the MS gas is adjusted by the MFC 241a. The MS gas is supplied into the process chamber 201 via the nozzle 249a and is exhausted from the exhaust port 231a. At this time, the MS gas is supplied to the wafer 200 (MS gas supply). Simultaneously, the valves 243c, 243f, and 243g may be opened to supply the $N_2$ gas into the process chamber 201 via the nozzles 249a to 249c respectively.

By supplying the MS gas to the wafer 200 under processing conditions as described hereinbelow, the MS gas can be decomposed in the gas phase to allow Si to be adsorbed (deposited) on the surface of the wafer 200, that is, on the Si seed layer formed on the wafer 200, thus forming a Si film. Since the MS gas containing no Cl is used as the third gas, the Si film formed on the wafer 200 becomes a film containing no Cl. Furthermore, the crystal structure of the Si film formed on the wafer 200 becomes amorphous under the processing conditions as described hereinbelow.

When starting the polycrystallization of the Si seed layer by the temperature rising by forming the Si film under the conditions as described hereinbelow, that is, under the third temperature higher than the second temperature, it becomes possible to allow the polycrystallization to further go ahead. Furthermore, when the Si seed layer is maintained in an amorphous state by the temperature rising, it is possible to start the polycrystallization of the Si seed layer at this step. In any case, at least a portion of the Si seed layer can be polycrystallized to change the Si seed layer to be in a mixed crystal state of an amorphous state and a polycrystal state or the polycrystal state. In addition, when the Si seed layer is maintained in the amorphous state by the temperature rising, it is also possible to maintain the Si seed layer in the amorphous state according to the processing conditions (the third temperature and the gas supply time) at this step. However, the Si seed layer maintained in the amorphous state at the time when this step is completed becomes in a state that it is more likely to be polycrystallized than the Si film in an amorphous state formed thereon.

After the formation of the Si film in the amorphous state on the Si seed layer on the wafer 200 is completed, the valve 243a is closed to stop the supply of the MS gas into the process chamber 201. Then, the gas or the like, which remains within the process chamber 201, are removed from the interior of the process chamber 201 under the same processing procedures and processing conditions as those of the purge in the pre-treatment.

The processing conditions in the Si film formation may be exemplified as follows:

MS gas supply flow rate: 0.01 to 5 slm
Supply time of MS gas: 1 to 300 minutes
$N_2$ gas supply flow rate (per gas supply pipe): 0 to 20 slm
Processing temperature (third temperature): 450 to 550 degrees C.
Processing pressure: 30 to 400 Pa (1.5 to 3 Torr).

As the third gas (silane-based gas), it may be possible to use, in addition to the MS gas, a silicon hydride gas such as a disilane ($Si_2H_6$) gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like. Furthermore, a low-order silicon hydride gas such as the MS gas may be used as the third gas to ensure that the crystal state of the Si film at the completion of the Si film formation is amorphous.

(Annealing)

After the formation of the Si film in the amorphous state on the Si seed layer is completed, an output of the heater 207 is adjusted so that the internal temperature of the process chamber 201, that is, the temperature of the wafer 200, is changed to a fourth temperature higher than the third temperature described above, and the Si seed layer and the Si film are each heat-treated (annealed). This step may be performed in a state in which the valves 243c, 243f, and 243g are opened to supply a $N_2$ gas into the process chamber 201, or may be performed in a state in which the valves 243c, 243f, and 243g are closed to stop the supply of the $N_2$ gas into the process chamber 201.

By performing the annealing under processing conditions as described hereinbelow, the Si seed layer and the Si film can be in a polycrystallized state. Further, before the annealing, there may be a case where the Si seed layer is in a mixed crystal state of an amorphous state and a polycrystal state, a case where the Si seed layer is in the polycrystal state, or a case where the Si seed layer is in the amorphous state, but, in any case, the Si seed layer can be polycystallized in advance, and the Si film can be polycrystallized after polycrystallizing the Si seed layer. Thus, the Si film can be polycrystallized by using the crystal grains of the Si seed layer which has been polycrystallized in advance as nuclei.

At this time, the Si film can be polycrystallized based on the crystal structure of the Si seed layer which has been polycrystallized in advance. The grain size of the crystal grains contained in the Si film which has been polycrystallized by performing the annealing process is influenced by the grain size of the crystal grains contained in the Si seed layer which has been polycrystallized in advance. For example, if the grain size of the crystal grains contained in the Si seed layer which has been polycrystallized in advance is large, the grain size of the crystal grains contained in the Si film which has been polycrystallized by performing the annealing process tends to be large. Furthermore, for example, if the grain size of the crystal grains contained in the Si seed layer which has been polycrystallized in advance is small, the grain size of the crystal grains contained in the Si film which has been polycrystallized by performing the annealing process tends to be small.

As described above, in the embodiments, in the Si seed layer formation, by implementing a cycle which non-simultaneously performs the HCDS gas supply and the $H_2$ gas supply a predetermined number of times, and setting the processing pressure in the $H_2$ gas supply higher than the processing pressure in the HCDS gas supply, it is possible to allow the Si seed layer formed on the wafer 200 to become a layer having a low Cl concentration. According to an intensive research, it has been found that Cl contained in the Si seed layer becomes a factor that inhibits a growth of crystal grains when polycrystallizing the Si seed layer. In the embodiments, by allowing the Si seed layer formed on the wafer 200 to become a layer having a low Cl concentration, it is possible to increase the grain size of the crystal grains grown in the Si seed layer when polycrystallizing the Si seed layer in advance. As a result, when the Si film is polycrystallized later, it becomes possible to increase the grain size of the crystal grains grown in the Si film.

The processing conditions in the annealing may be exemplified as follows:

$N_2$ gas supply flow rate (per gas supply pipe): 0 to 20 slm

Processing temperature (fourth temperature): 600 to 1,000 degrees C.

Processing pressure: 0.1 to 100,000 Pa

Processing time: 1 to 300 minutes.

(After-Purge and Atmospheric Pressure Return)

After the polycrystallization of Si seed layer and the Si film formed on the wafer 200 is completed, the $N_2$ gas as a purge gas is supplied from each of the nozzles 249a to 249c into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

(3) Effects According to the Embodiments

According to the embodiments, one or more effects as set forth below may be achieved.

(a) By implementing a cycle which non-simultaneously performs the HCDS gas supply and the $H_2$ gas supply a predetermined number of times in the Si seed layer formation, and setting the processing pressure in the $H_2$ gas supply higher than the processing pressure in the HCDS gas supply, it is possible to allow the Si seed layer formed on the surface of the wafer 200 to become a layer having a low Cl concentration. This makes it possible to increase the grain size of the crystal grains grown in the Si seed layer when polycrystallizing the Si seed layer in advance. As a result, it is possible to increase the grain size of the crystal grains grown in the Si film when polycrystallizing the Si film based on the crystal structure of the Si seed layer which has been polycrystallized in advance.

(b) By increasing the grain size of the crystal grains grown in the Si film, it becomes possible to adjust the surface roughness (RMS) of the polycrystallized Si film to be reduced. It is considered that this is influenced by, as one factor, the density of crystal grain boundaries existing per unit area of the surface of the polycrystallized Si film being reduced by increasing the grain size of the crystal grains contained in the polycrystallized Si film. Furthermore, the term "surface roughness" means a degree of surface roughness. The expression "surface roughness is reduced" means that the surface is smooth.

(c) By increasing the grain size of the crystal grains grown in the Si film, it is possible to adjust an electrical resistance of the polycrystallized Si film in an in-plane direction of the wafer 200, that is, in a creepage direction, to be reduced. It is considered that this is also influenced by, as one factor, the density of the grain boundaries existing per unit area of the surface of the polycrystallized Si film being reduced by increasing the grain size of the crystal grains contained in the polycrystallized Si film.

(d) By setting the supply flow rate of the $H_2$ gas in the $H_2$ gas supply higher than the supply flow rate of the HCDS gas in the HCDS gas supply, it is possible to further reduce the Cl concentration in the Si seed layer formed on the wafer 200. Thus, it is possible to more reliably achieve the effects (a) to (c) described above.

(e) By setting the supply time of the $H_2$ gas in the $H_2$ gas supply longer than the supply time of the HCDS gas in the HCDS gas supply, it is possible to further reduce the Cl concentration in the Si seed layer formed on the wafer 200. Thus, it is possible to more reliably achieve the effects (a) to (c) described above.

(f) By setting the thickness of the Si seed layer formed on the wafer 200 at a thickness of less than one atomic layer by appropriately adjusting the processing conditions in the Si seed layer formation, it is possible to further reduce the Cl concentration in the Si seed layer formed on the wafer 200. In addition, it is possible to significantly reduce the Cl content (absolute amount) in the Si seed layer. Thus, it is possible to more reliably achieve the effects (a) to (c) described above. Furthermore, it is possible to shorten the time required to form the Si seed layer and to improve the productivity of the substrate processing.

Moreover, by setting the thickness of the Si seed layer formed on the wafer 200 at a thickness of less than one atomic layer, it is possible to improve the step coverage of the Si film formed on the Si seed layer and the film thickness uniformity in the plane of the wafer. It is also possible to reduce the surface roughness of the Si film formed on the Si seed layer.

(g) By forming the Si seed layer before the Si film formation, it is possible to shorten an incubation time (growth delay) of the Si film formed on the wafer 200 and to improve the productivity of the substrate processing.

(h) By performing the pre-treatment before the Si seed layer formation to clean the surface of the wafer 200 in advance, it is possible to efficiently form the Si seed layer by promoting the adsorption of Si in the subsequent Si seed layer formation. Thus, it is possible to improve the productivity of the substrate processing.

Further, by cleaning the entire surface of the wafer 200 in advance, it is possible to form the Si seed layer over the entire surface of the wafer 200 uniformly and continuously. As a result, it is possible to further improve the step coverage of the Si film formed on the Si seed layer and the film thickness uniformity in the plane of the wafer. In addition, it is possible to further reduce the surface roughness of the Si film formed on the Si seed layer.

(i) The effects mentioned above can be similarly achieved in the case where the aforementioned halogen-based gas other than the HCDS gas is used as the first gas (first halosilane gas), or in the case where the aforementioned reducing gas other than the $H_2$ gas is used as the second gas (H-containing gas), or in the case where the aforementioned silane-based gas other than the MS gas is used as the third gas (silane-based gas), or in the case where the aforementioned halogen-based gas other than the DCS gas is used as the fourth gas (second halosilane gas), or in the case where an inert gas other than the $N_2$ gas is used.

Second Embodiments of the Present Disclosure

Figure 5:
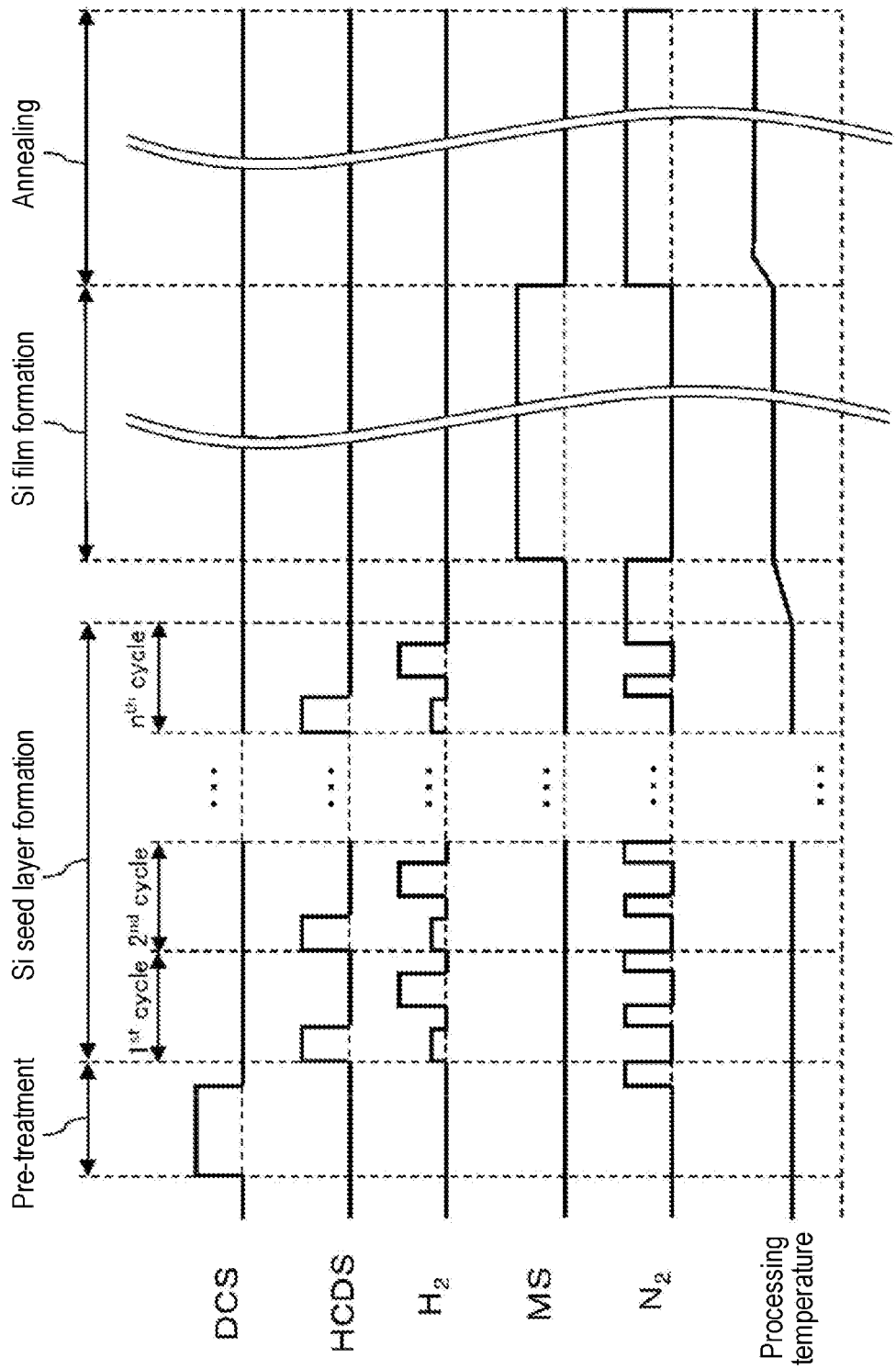
FIG. 5 is a diagram illustrating a substrate processing sequence according to a second embodiment of the present disclosure.

Next, a second embodiment of the present disclosure will be described mainly with reference to FIG. 5.

As in the substrate processing sequence illustrated in FIG. 5 and described below, when a HCDS gas is supplied in the Si seed layer formation, a $H_2$ gas may be supplied to a wafer 200 together with the HCDS gas (HCDS gas+$H_2$ gas supply). That is, in the Si seed layer formation, a cycle which non-simultaneously performs the HCDS gas+$H_2$ gas supply and the $H_2$ gas supply may be implemented a predetermined number of times (n times, where n is an integer of 1 or more).

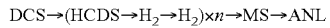

Even according to the present embodiment, the same effects as those of the aforementioned first embodiment may be achieved. Furthermore, by supplying the $H_2$ gas together with the HCDS gas in the HCDS gas+$H_2$ gas supply, it is possible to desorb Cl from the nucleus formed on the wafer 200. This makes it possible to further reduce the Cl concentration in the Si seed layer formed on the wafer 200. As a result, it is possible to more reliably achieve the effects (a) to (c) described in the first embodiment.

In addition, the supply flow rate of the $H_2$ gas in the HCDS gas+$H_2$ gas supply may be set lower than the supply flow rate of the $H_2$ gas in the subsequent $H_2$ gas supply, for example, set be at a flow rate which falls within a range of 0.1 to 0.5 slm. By doing so, it is possible to avoid an excessive reduction in the partial pressure of the HCDS gas in the process chamber 201 in the HCDS gas+$H_2$ gas supply, and to suppress a reduction in the formation rate of the Si seed layer.

Third Embodiment of the Present Disclosure

Figure 6:
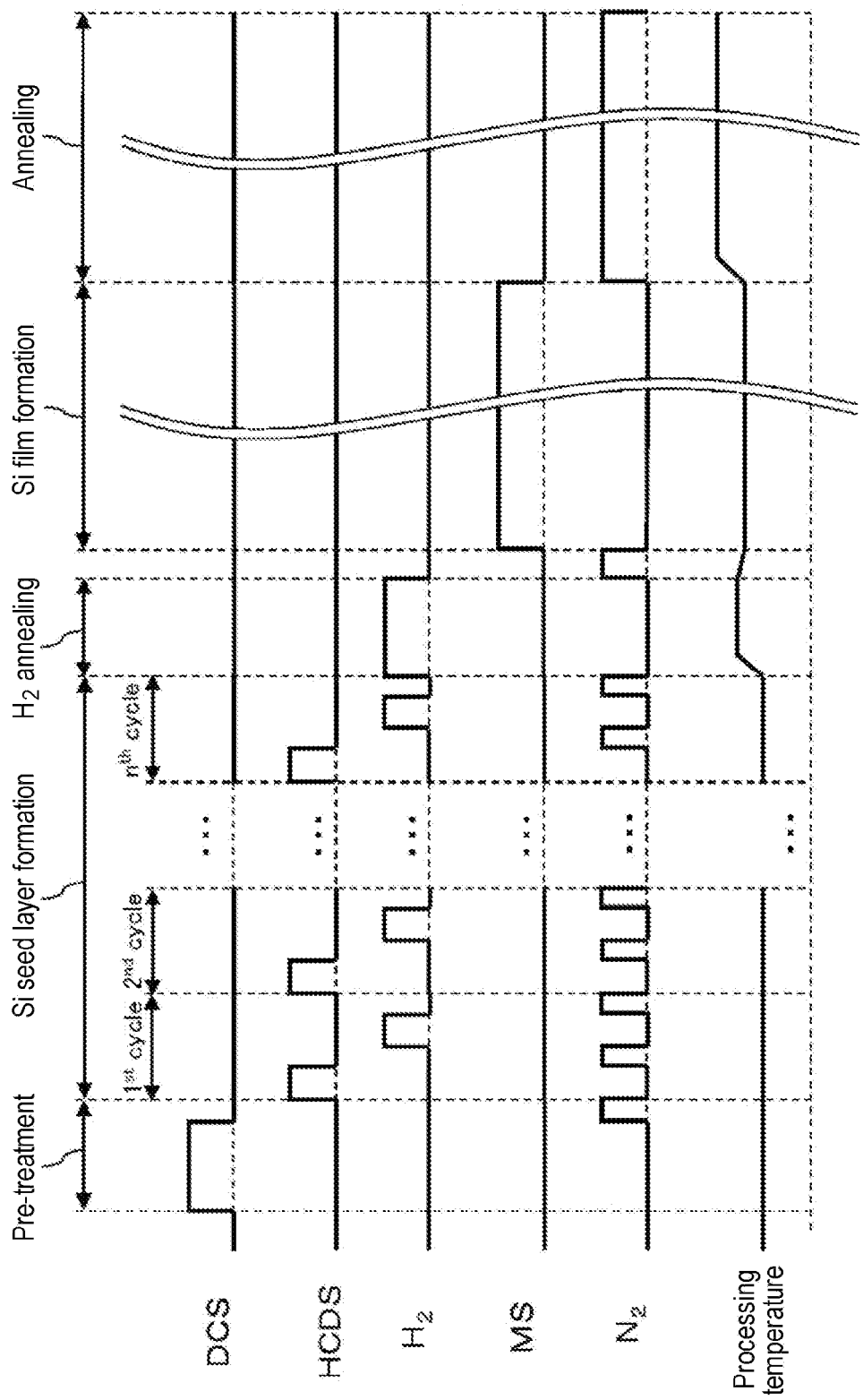
FIG. 6 is a diagram illustrating a substrate processing sequence according to a third embodiment of the present disclosure.

Next, a third embodiment of the present disclosure will be described mainly with reference to FIG. 6.

As in the substrate processing sequence illustrate in FIG. 6 and described below, a step of supplying a $H_2$ gas to the wafer 200 ($H_2$ annealing) may be performed after performing the Si seed layer formation and before performing the Si film formation.

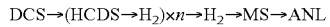

Even according to the present embodiment, the same effects as those of the aforementioned first embodiments may be achieved. Furthermore, by performing the $H_2$ annealing, it is possible to further desorb Cl from the Si seed layer formed on the wafer 200 and to further reduce the Cl concentration in this layer. As a result, it is possible to achieve more reliably the effects (a) to (c) described above.

The processing conditions in the $H_2$ annealing may be exemplified as follows:

$H_2$ gas supply flow rate: 2 to 10 slm
$N_2$ gas supply flow rate (per gas supply pipe): 0 to 20 slm
Gas supply time: 2 to 20 minutes
Processing temperature (fourth temperature): 600 to 800 degrees C.
Processing pressure: 1,333 to 13,332 Pa (10 to 100 Torr).

Furthermore, if the processing temperature is lower than 600 degrees C., the effect of desorbing Cl from the Si seed layer formed on the wafer 200 may be lowered. By setting the treatment temperature at a temperature of 600 degrees C. or higher, it is possible to sufficiently achieve the effect of desorbing Cl from the Si seed layer.

If the processing temperature exceeds 800 degrees C., there may be a case where the time required to change the temperature of the wafer 200 is prolonged, which affects the throughput of the substrate processing, that is, the productivity of the substrate processing. By setting the processing temperature at a temperature of 800 degrees C. or lower, it is possible to suppress an increase in the time required to change the temperature of the wafer 200 and to reduce an influence on the throughput of the substrate processing, that is, the productivity of the substrate processing.

Further, if the processing pressure is lower than 1,333 Pa (10 Torr), Si contained in the Si seed layer formed on the wafer 200 may be easily migrated and the Si may aggregate to cause the Si density of the Si seed layer in the plane of the wafer to be non-uniform. In addition, the Si seed layer may be a discontinuous layer. As a result, the step coverage of the Si film formed on the Si seed layer and the film thickness uniformity in the plane of the wafer may be deteriorated. Moreover, the surface roughness of the Si film formed on the Si seed layer may be increased. By setting the processing pressure at a pressure of 1,333 Pa or higher, it is possible to suppress the migration of Si contained in the Si seed layer formed on the wafer 200. As a result, it is possible to avoid the deterioration of the step coverage of the Si film formed on the Si seed layer, the deterioration of the film thickness uniformity in the plane of the wafer, and the increase of the surface roughness.

If the processing pressure exceeds 13,332 Pa (100 Torr), there may be a case where the time required to change the internal pressure of the process chamber 201 is prolonged, which affects the throughput of the substrate processing, that is, the productivity of the substrate processing. By setting the processing pressure at a pressure of 13,332 Pa or lower, it is possible to suppress an increase in the time required to change the internal pressure of the process chamber 201 and to reduce the influence on the throughput of the substrate processing, that is, the productivity of the substrate processing.

Furthermore, the processing temperature (fourth temperature) in the $H_2$ annealing may be set higher than the processing temperature (second temperature) in the Si seed layer formation. By doing so, it is possible to further promote the desorption of Cl from the Si seed layer formed on the wafer 200. As a result, it is possible to more reliably achieve the effects (a) to (c) described above.

Moreover, the processing temperature (fourth temperature) in the $H_2$ annealing may be set higher than the processing temperature (third temperature) in the Si film formation. By doing so, it is possible to further promote the desorption of Cl from the Si seed layer formed on the wafer 200. As a result, it is possible to more reliably achieve the effects (a) to (c) described above.

Furthermore, the processing pressure in the $H_2$ annealing may be set higher than the processing pressure in the HCDS gas supply. By doing so, it is possible to suppress the migration of Si contained in the Si seed layer formed on the wafer 200, and as a result, it is possible to suppress the deterioration of the step coverage of the Si film formed on the Si seed layer and the film thickness uniformity in the plane of the wafer. It is also possible to prevent the surface roughness of the Si film formed on the Si seed layer from increasing.

As the second gas (H-containing gas), it may be possible to use, in addition to the $H_2$ gas, a reducing gas such as a $D_2$ gas or the like.

OTHER EMBODIMENTS OF THE PRESENT DISCLOSURE

While various embodiments of the present disclosure have been specifically described above, the present disclosure is not limited to the aforementioned embodiments but may be variously modified without departing from the spirit of the present disclosure.

In the aforementioned embodiments, there have been described examples in which a series of steps from the Si seed layer formation to the annealing is performed in the same process chamber 201 (in-situ). However, the present disclosure is not limited to these embodiments. For example, a series of steps from the Si seed layer formation to the Si film formation may be performed in the same process chamber, and then the annealing may be performed in another process chamber (ex-situ).

Even in this case, the same effects as those of the aforementioned embodiments may be achieved.

Further, for example, another step (another film formation) of forming a film (a silicon oxide film, a silicon nitride film, or the like) other than the Si film may be performed between the Si film formation and the annealing. In this case, the series of steps from the Si seed layer formation to the annealing, that is, the series of steps including another film formation, may be performed in the same process chamber (first process chamber). Further, the series of steps from the Si seed layer formation to the Si film formation may be performed in the same process chamber (first process chamber) and the series of steps from another film formation to the annealing may be performed in another process chamber (second process chamber). Further, the series of steps from the Si seed layer formation to the Si film formation may be performed in the same process chamber (first process chamber), another film formation may be performed in another process chamber (second process chamber), and the annealing may be performed in yet another process chamber (third process chamber) or in the first process chamber. Even in these cases, the same effects as those of the aforementioned embodiments may be achieved.

In various cases described above, if the series of steps is performed in-situ, the wafer 200 is not exposed to the atmosphere during the process, and the wafer 200 can be consistently processed while being kept in vacuum, it is possible to perform stable substrate processing. Further, if some steps are performed ex-situ, the internal temperature of each process chamber can be set in advance at, for example, the processing temperature at each step, or at a temperature close thereto. Thus, it is possible to shorten the time required to adjust the temperature and to improve the production efficiency.

In the aforementioned embodiments, there has been described the example in which the nozzles 249a to 249c are installed adjacent (closer) to each other, but the present disclosure is not limited to these embodiments. For example, the nozzles 249a and 249c may be installed at positions apart from the nozzle 249b in a space with an annular shape, when seen in the plane view, between the inner wall of the reaction tube 203 and the wafer 200. Even in this case, the same effects as those of the aforementioned embodiments may be achieved.

Recipes used in the substrate processing may be provided individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the contents of the substrate processing. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-provided recipes but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the existing input/output device 122 of the substrate processing apparatus.

In the aforementioned embodiments, there has been described the example in which films are formed by using a batch-type substrate processing apparatus capable of processing a plurality of substrates at a time. The present disclosure is not limited to the aforementioned embodiments but may also be appropriately applied to, for example, a case where films are formed by using a single-wafer-type substrate processing apparatus capable of processing a single substrate or several substrates at a time. In addition, in the aforementioned embodiments, there has been described the example in which films are formed by using the substrate processing apparatus provided with a hot-wall-type process furnace. The present disclosure is not limited to the aforementioned embodiments but may also be appropriately applied to a case where films are formed by using a substrate processing apparatus provided with a cold-wall-type process furnace.

Even when these substrate processing apparatuses are used, the film formation may be performed by the processing sequences and processing conditions similar to those of the embodiments and the modifications described above. Effects similar to those of the aforementioned embodiments and the modifications may be achieved.

The embodiments and the modifications described above may be appropriately combined with one another. The processing procedures and processing conditions at this time may be similar to, for example, the processing procedures and processing conditions of the aforementioned embodiments.

EXAMPLES

A process of forming a Si seed layer on a wafer and forming a Si film on the Si seed layer was performed by using the substrate processing apparatus illustrated in FIG. 1 and substrate processing sequences described below to produce five kinds of evaluation samples (hereinafter, referred to as samples). The processing conditions at each step of the substrate processing sequences described below were set to predetermined conditions which fall within the processing condition range at each step described in each of the aforementioned embodiments, and were used as common conditions for samples 1 to 5. Furthermore, in samples 1 to 4, the thickness of each Si seed layer formed on the wafer was set at a thickness of one atomic layer or more (13 Å). In addition, in sample 5, the thickness of the Si seed layer formed on the wafer was set at a thickness of less than one atomic layer (less than 1 Å).

Sample 1: DCS→HCDS×n→MS→ANL
Sample 2: DCS→(HCDS→$H_2$)×n→MS→ANL
Sample 3: DCS→(HCDS→$H_2$→$H_2$)×n→MS→ANL
Sample 4: DCS→(HCDS→$H_2$)×n→$H_2$→MS→ANL
Sample 5: DCS→(HCDS→$H_2$)×n→MS→ANL Then, a Cl concentration (at/cm$^3$) of each Si seed layer in samples 1 to 5, and an average grain size (μm), step coverage (%) and a film density (g/cm$^3$) of the crystal grains of each Si film in samples 1 to 5 were each measured. The results are shown in FIG. 7.

From FIG. 7, it can be seen that the Cl concentration in each Si seed layer in samples 2 to 5 is lower than the Cl concentration in the Si seed layer in sample 1. That is, when forming the Si seed layer by performing the HCDS gas supply a predetermined number of times, it can be seen that the Cl concentration in the Si seed layer is more reduced when a $H_2$ gas is supplied non-simultaneously with the HCDS gas supply than when the $H_2$ gas supply is not performed.

Further, it can be seen from FIG. 7 that the Cl concentration in the Si seed layer in sample 3 is lower than the Cl concentration in the Si seed layer in sample 2. That is, when the HCDS gas is supplied in the Si seed layer formation, it can be seen that the Cl concentration in the Si seed layer can be more reduced when the $H_2$ gas is supplied to the wafer together with the HCDS gas than when the $H_2$ gas is not supplied together with the HCDS gas.

In addition, it can be seen from FIG. 7 that the average grain size of the crystal grains of the Si film in sample 3 is larger than the average grain size of the crystal grains of the Si film in sample 2. That is, when the HCDS gas is supplied in the Si seed layer formation, it can be seen that the average grain size of the crystal grains of the Si film can be more increased when the $H_2$ gas is supplied to the wafer together with the HCDS gas than when the $H_2$ gas is not supplied together with the HCDS gas. This is considered to be because the average grain size of the crystal grains of the Si seed layer in sample 3 which has been polycrystallized in advance becomes larger than the average grain size of the crystal grains of the Si seed layer in sample 2 which has been polycrystallized in advance, due to the difference in the Cl concentration described above in the Si seed layer.

Moreover, it can be seen from FIG. 7 that the Cl concentration in the Si seed layer in sample 4 is lower than the Cl concentration in the Si seed layer in sample 2. That is, it can be seen that the Cl concentration in the Si seed layer can be more reduced when the $H_2$ annealing is performed after the Si seed layer is formed than when the $H_2$ annealing is not performed after the Si seed layer is formed.

Furthermore, it can be seen that the Cl concentration in the Si seed layer in sample 4 is lower than the Cl concentration in the Si seed layer in sample 3. That is, it can be seen that the effect of reducing the Cl concentration by performing the $H_2$ annealing after the Si seed layer formation becomes larger than when the $H_2$ gas is supplied to the wafer together with the HCDS gas when supplying the HCDS gas in the Si seed layer formation.

In addition, it can be seen from FIG. 7 that the Cl concentration in the Si seed layer in sample 5 is lower than the Cl concentration in the Si seed layer in sample 2. That is, it can be seen that a case where the Cl concentration in the Si seed layer can be more reduced when the thickness of the Si seed layer formed on the wafer is set at a thickness of less than one atomic layer than when the thickness of the Si seed layer formed on the wafer is set at a thickness of one 1 atomic layer or more.

Further, it can also be seen that the Cl concentration in the Si seed layer in sample 5 is lower than the Cl concentration in each Si seed layer in samples 3 and 4. That is, it can be seen that the effect of reducing the Cl concentration by setting the thickness of the Si seed layer at a thickness of less than one atomic layer becomes larger than when the $H_2$ gas is supplied to the wafer together with the HCDS gas when supplying the HCDS gas in the Si seed layer formation (sample 3) and when the $H_2$ annealing is performed after the Si seed layer formation (sample 4).

Moreover, it can be seen from FIG. 7 that the average grain size of the crystal grains of the Si film in sample 5 is larger than the average grain size of the crystal grains of each Si film in samples 2 and 3. This is considered to be because the average grain size of the crystal grains of the Si seed layer in sample 5 which has been polycrystallized in advance becomes larger than the average grain size of the crystal grains of each Si seed layer in samples 2 and 3 which have been polycrystallized in advance due to the difference in the Cl concentration described above in the Si seed layer.

In addition, it can be seen from FIG. 7 that the step coverage of the Si film in sample 5 is better than the step coverage of the Si film in sample 2. That is, it can be seen that the step coverage of the Si film formed on the Si seed layer can be improved by setting the thickness of the Si seed layer formed on the wafer at a thickness of less than one atomic layer.

Further, it can be seen from FIG. 7 that the film density of the Si film in sample 5 is higher than the film density of the Si film in sample 2. That is, it can be seen that the film density of the Si film formed on the Si seed layer can be increased by setting the thickness of the Si seed layer formed on the wafer at a thickness of less than one atomic layer.

According to the embodiments of the present disclosure, it is possible to improve characteristics of a film containing silicon formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of processing a substrate, comprising:
  (a) forming a layer on a substrate by performing a cycle a predetermined number of times, the cycle including:
    (a1) supplying a first gas containing halogen and silicon to the substrate; and
    (a2) supplying a second gas containing at least hydrogen to the substrate; and

(b) forming a film containing silicon on the layer by supplying a third gas containing silicon to the substrate,
wherein a pressure of a space in which the substrate is located in (a2) is set higher than a pressure of the space in which the substrate is located in (a1).

2. The method according to claim 1, wherein a supply flow rate of the second gas in (a2) is set higher than a supply flow rate of the first gas in (a1).

3. The method according to claim 1, wherein a supply time of the second gas in (a2) is set longer than a supply time of the first gas in (a1).

4. The method according to claim 1, wherein a processing temperature in (a) is set to 350 degrees C. or higher and 450 degrees C. or lower.

5. The method according to claim 4, wherein the pressure of the space in which the substrate is located in (a1) is set to 667 Pa or higher and 1,200 Pa or lower.

6. The method according to claim 4, wherein the pressure of the space in which the substrate is located in (a2) is set to 1,333 Pa or higher and 13,332 Pa or lower.

7. The method according to claim 1, wherein a processing temperature in (a) is set to 350 degrees C. or higher and 400 degrees C. or lower.

8. The method according to claim 1, wherein a thickness of the layer formed in (a) is set at a thickness of less than one atomic layer.

9. The method according to claim 1, wherein (a1) further comprises supplying the second gas to the substrate, and in (a1), the second gas is supplied to the substrate together with the first gas.

10. The method according to claim 9, wherein a supply flow rate of the second gas in (a1) is set lower than a supply flow rate of the second gas in (a2).

11. The method according to claim 1, further comprising (c) supplying the second gas to the substrate after performing (a) and before performing (b).

12. The method according to claim 11, wherein a processing temperature in (c) is set higher than a processing temperature in (a).

13. The method according to claim 11, wherein a processing temperature in (c) is set higher than a processing temperature in (b).

14. The method according to claim 11, wherein a pressure of the space in which the substrate is located in (c) is set higher than the pressure of the space in which the substrate is located in (a1).

15. The method according to claim 11, wherein a processing temperature in (c) is set to 600 degrees C. or higher and 850 degrees C. or lower.

16. The method according to claim 15, wherein a pressure of the space in which the substrate is located in (c) is set to 1,333 Pa or higher and 13,332 Pa or lower.

17. The method according to claim 1, further comprising (d) supplying a fourth gas containing halogen and silicon to the substrate before performing (a).

18. The method according to claim 17, wherein a supply time of the fourth gas in (d) is set longer than a supply time of the first gas in (a1).

19. A method of processing a substrate, comprising:
forming a layer on a substrate by performing a cycle a predetermined number of times, the cycle including:
(a1) supplying a first gas containing halogen and silicon to the substrate; and
(a2) supplying a second gas containing at least hydrogen to the substrate;
wherein a pressure of a space in which the substrate is located in (a2) is set higher than a pressure of the space in which the substrate is located in (a1).

20. A method of manufacturing a semiconductor device, comprising:
(a) forming a layer on a substrate by performing a cycle a predetermined number of times, the cycle including:
(a1) supplying a first gas containing halogen and silicon to the substrate; and
(a2) supplying a second gas containing at least hydrogen to the substrate; and
(b) forming a film containing silicon on the layer by supplying a third gas containing silicon to the substrate,
wherein a pressure of a space in which the substrate is located in (a2) is set higher than a pressure of the space in which the substrate is located in (a1).

* * * * *